(12) United States Patent
Stevick (10) Patent No.: US 9,289,822 B2
(45) Date of Patent: Mar. 22, 2016

(54) PRODUCTION OF LARGE-AREA BULK METALLIC GLASS SHEETS BY SPINNING

(71) Applicant: Crucible Intellectual Property, LLC, Dana Point, CA (US)

(72) Inventor: Joseph W. Stevick, Dana Point, CA (US)

(73) Assignee: Crucible Intellectual Property, LLP, Rancho Santa Margarita, CA (US)

( * ) Notice: Subject to any disclaimer, the term of this patent is extended or adjusted under 35 U.S.C. 154(b) by 0 days.

(21) Appl. No.: 14/828,302

(22) Filed: Aug. 17, 2015

(65) Prior Publication Data

US 2015/0352632 A1    Dec. 10, 2015

Related U.S. Application Data (62) Division of application No. 13/803,745, filed on Mar. 14, 2013, now Pat. No. 9,108,243.

(51) Int. Cl.
*B22D 13/04* (2006.01)
*B22D 25/06* (2006.01)
*C22C 45/00* (2006.01)

(52) U.S. Cl.
CPC .............. *B22D 13/04* (2013.01); *B22D 25/06* (2013.01); *C22C 45/00* (2013.01)

(58) Field of Classification Search
CPC ................. B22D 13/00; B22D 13/08; B22D 13/10–13/108

USPC .......... 164/114, 118, 286, 292, 297; 427/240, 427/241

See application file for complete search history.

(56) References Cited

U.S. PATENT DOCUMENTS

| | | | | |
|---|---|---|---|---|
| 4,561,486 A | * | 12/1985 | Maeda | ............... C30B 11/00 117/924 |
| 2005/0147748 A1 | * | 7/2005 | Nguyen | ............. H01L 21/6715 427/230 |
| 2012/0315578 A1 | * | 12/2012 | Lee | .......................... G03F 7/168 430/270.1 |
| 2013/0217217 A1 | * | 8/2013 | Kobayashi | ........ H01L 21/31144 438/585 |

* cited by examiner

*Primary Examiner* — Kevin E Yoon
(74) *Attorney, Agent, or Firm* — Brownstein Hyatt Farber Schreck, LLP (57) ABSTRACT

Disclosed herein is a device comprising: vacuum chamber; a stage configured to receive BMG in a molten state or a BMG feedstock, configured to spin, and located in the vacuum chamber; a heater configured to melt the BMG feedstock or to keep BMG in a molten state molten; wherein the stage comprises one or more conduits therein and the conduits are configured to accommodate a cooling fluid. Also disclosed herein is a method of forming a solid BMG sheet, the method comprising: disposing BMG in a molten state onto a stage; spreading the BMG in a molten state into a sheet of BMG in a molten state by spinning the stage; cooling the sheet of BMG in a molten state to form a solid BMG sheet.

20 Claims, 8 Drawing Sheets

FIGURE 1

PRIOR ART

FIGURE 2

PRIOR ART

FIGURE 7

PRODUCTION OF LARGE-AREA BULK METALLIC GLASS SHEETS BY SPINNING

CROSS-REFERENCE TO RELATED APPLICATION

This application is a division of U.S. patent application Ser. No. 13/803,745, filed Mar. 14, 2013, and entitled "Production of Large-Area Bulk Metallic Glass Sheets," the entirety of which is incorporated by reference as if fully disclosed herein.

FIELD

The present disclosure is generally related to the production of large-area sheets of bulk metallic glass (BMG) alloys.

BACKGROUND

A large portion of the metallic alloys in use today are processed by solidification casting, at least initially. The metallic alloy is melted and cast into a metal or ceramic mold, where it solidifies. The mold is stripped away, and the cast metallic piece is ready for use or further processing. The as-cast structure of most materials produced during solidification and cooling depends upon the cooling rate. There is no general rule for the nature of the variation, but for the most part the structure changes only gradually with changes in cooling rate. On the other hand, for the bulk-solidifying amorphous alloys the change between the amorphous state produced by relatively rapid cooling and the crystalline state produced by relatively slower cooling is one of kind rather than degree—the two states have distinct properties.

Bulk-solidifying amorphous alloys, or bulk metallic glasses ("BMG"), are a recently developed class of metallic materials. These alloys may be solidified and cooled at relatively slow rates, and they retain the amorphous, non-crystalline (i.e., glassy) state at room temperature. This amorphous state can be highly advantageous for certain applications. If the cooling rate is not sufficiently high, crystals may form inside the alloy during cooling, so that the benefits of the amorphous state are partially or completely lost. For example, one risk with the creation of bulk amorphous alloy parts is partial crystallization due to either slow cooling or impurities in the raw material.

Bulk-solidifying amorphous alloys have been made in a variety of metallic systems. They are generally prepared by quenching from above the melting temperature to the ambient temperature. Generally, high cooling rates such as one on the order of $10^{5\circ}$ C./sec, are needed to achieve an amorphous structure. The lowest rate by which a bulk solidifying alloy can be cooled to avoid crystallization, thereby achieving and maintaining the amorphous structure during cooling, is referred to as the "critical cooling rate" for the alloy. In order to achieve a cooling rate higher than the critical cooling rate, heat has to be extracted from the sample. Thus, the thickness of articles made from amorphous alloys often becomes a limiting dimension, which is generally referred to as the "critical (casting) thickness." A critical thickness of an amorphous alloy can be obtained by heat-flow calculations, taking into account the critical cooling rate.

Until the early nineties, the processability of amorphous alloys was quite limited, and amorphous alloys were readily available only in powder form or in very thin foils or strips with a critical thickness of less than 100 micrometers. A class of amorphous alloys based mostly on Zr and Ti alloy systems was developed in the nineties, and since then more amorphous alloy systems based on different elements have been developed. These families of alloys have much lower critical cooling rates of less than $10^{3\circ}$ C./sec, and thus they have much larger critical casting thicknesses than their previous counterparts. However, little has been shown regarding how to utilize and/or shape these alloy systems into structural components, such as those in consumer electronic devices. In particular, pre-existing forming or processing methods often result in high product cost when it comes to high aspect ratio products (e.g., thin sheets) or three-dimensional hollow products. Moreover, the pre-existing methods can often suffer the drawbacks of producing products that lose many of the desirable mechanical properties as observed in an amorphous alloy.

SUMMARY

Disclosed herein is a device having a vacuum chamber; a stage configured to receive BMG in a molten state or a BMG feedstock, configured to spin, and located in the vacuum chamber; a heater configured to melt the BMG feedstock or to keep BMG in a molten state molten; wherein the stage comprises one or more conduits therein and the conduits are configured to accommodate a cooling fluid.

According to an embodiment, the vacuum chamber has a heated region and an unheated region, wherein the heated region is maintained at a temperature at which the BMG feedstock and the BMG in a molten state remain molten.

According to an embodiment, the device further has a conduit configured to feed the BMG in a molten state onto the stage.

According to an embodiment, the heated region is heated by induction.

According to an embodiment, the stage is configured to spin at a speed sufficient to spread the BMG in a molten state on the spinning stage into a BMG sheet.

According to an embodiment, the stage is move from the heated region into the unheated region.

According to an embodiment, the BMG feedstock is a bar, rod, or powder of BMG or a composite of materials that form a BMG through melting of the BMG feedstock.

According to an embodiment, the cooling fluid is configured to cool and solidify the BMG sheet at a rate at which the BMG sheet remains amorphous after solidification.

According to an embodiment, the stage has a heater configured to melt the BMG feedstock and/or keep the BMG in a molten state molten.

According to an embodiment, the stage has an electrostatic clamp configured to clamp a substrate onto the stage.

According to an embodiment, the stage has a cavity configured to accommodate a volume of BMG in a molten state.

Disclosed herein is a method of forming a BMG sheet, having: disposing BMG in a molten state onto a stage; spreading the BMG in a molten state into the BMG sheet by spinning the stage; cooling the BMG sheet.

According to an embodiment, disposing BMG in a molten state onto a stage has disposing a BMG feedstock in a solid form onto the stage and melting the BMG feedstock.

According to an embodiment, the stage is in a vacuum chamber.

According to an embodiment, cooling the BMG sheet is performed by flowing a cooling fluid through a conduit in the stage.

According to an embodiment, cooling the BMG sheet is at a rate at which the BMG sheet remains amorphous after solidification.

According to an embodiment, the BMG sheet is cooled while the stage is spinning.

According to an embodiment, the stage comprises a cavity configured to accommodate a volume of BMG in a molten state.

According to an embodiment, the BMG sheet has an essentially parabolic surface.

According to an embodiment the stage is patterned with features so that an underside (i.e., the side in contact with the stage) of the BMG sheet replicates the features of the stage. The features may have a size from 1-1000 nm, 1 μm 1 mm, or above 1 mm.

In one embodiment, a top surface of the BMG is suitable as a reflective surface and is essentially free of contamination or texture.

DETAILED DESCRIPTION

All publications, patents, and patent applications cited in this Specification are hereby incorporated by reference in their entirety.

The articles "a" and "an" are used herein to refer to one or to more than one (i.e., to at least one) of the grammatical object of the article. By way of example, "a polymer resin" means one polymer resin or more than one polymer resin. Any ranges cited herein are inclusive. The terms "substantially" and "about" used throughout this Specification are used to describe and account for small fluctuations. For example, they can refer to less than or equal to ±5%, such as less than or equal to ±2%, such as less than or equal to ±1%, such as less than or equal to ±0.5%, such as less than or equal to ±0.2%, such as less than or equal to ±0.1%, such as less than or equal to ±0.05%.

Bulk-solidifying amorphous alloys, or bulk metallic glasses ("BMG"), are a recently developed class of metallic materials. These alloys may be solidified and cooled at relatively slow rates, and they retain the amorphous, non-crystalline (i.e., glassy) state at room temperature. Amorphous alloys have many superior properties than their crystalline counterparts. However, if the cooling rate is not sufficiently high, crystals may form inside the alloy during cooling, so that the benefits of the amorphous state can be lost. For example, one challenge with the fabrication of bulk amorphous alloy parts is partial crystallization of the parts due to either slow cooling or impurities in the raw alloy material. As a high degree of amorphicity (and, conversely, a low degree of crystallinity) is desirable in BMG parts, there is a need to develop methods for casting BMG parts having controlled amount of amorphicity.

Figure 1:
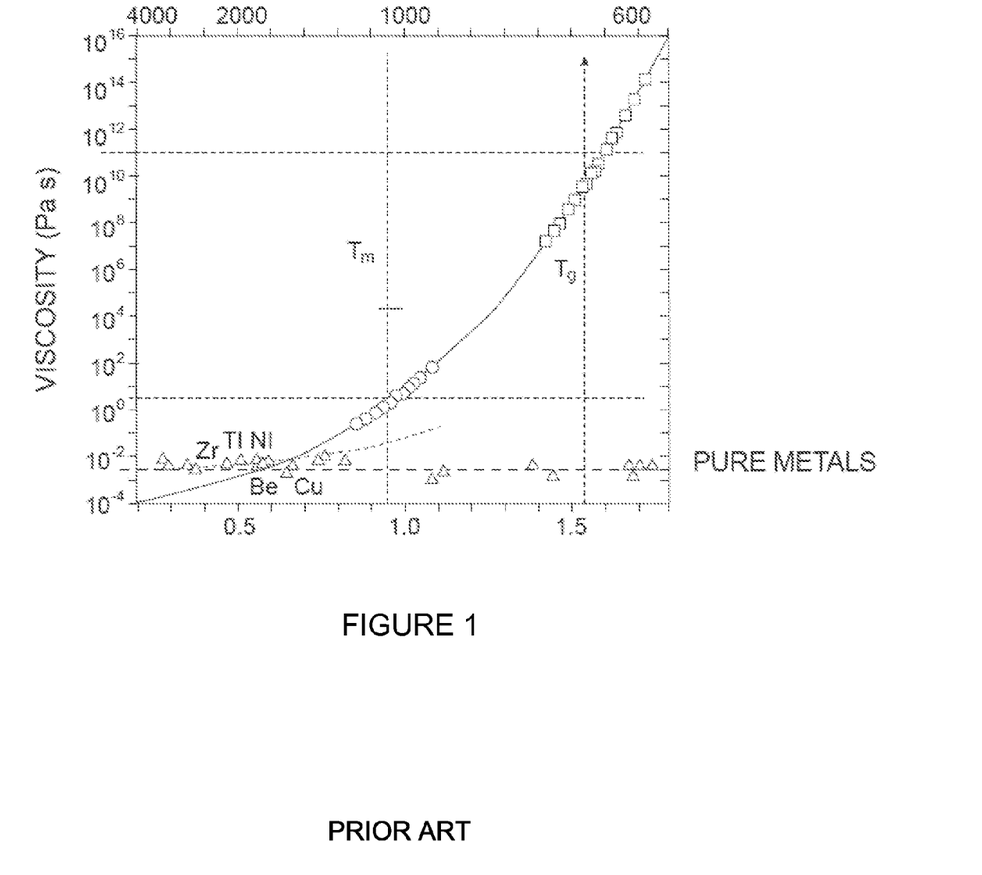
FIG. 1 provides a temperature-viscosity diagram of an exemplary bulk solidifying amorphous alloy.

FIG. 1 (obtained from U.S. Pat. No. 7,575,040) shows a viscosity-temperature graph of an exemplary bulk solidifying amorphous alloy, from the VIT-001 series of Zr—Ti—Ni—Cu—Be family manufactured by Liquidmetal Technology. It should be noted that there is no clear liquid/solid transformation for a bulk solidifying amorphous metal during the formation of an amorphous solid. The molten alloy becomes more and more viscous with increasing undercooling until it approaches solid form around the glass transition temperature. Accordingly, the temperature of solidification front for bulk solidifying amorphous alloys can be around glass transition temperature, where the alloy will practically act as a solid for the purposes of pulling out the quenched amorphous sheet product.

Figure 2:
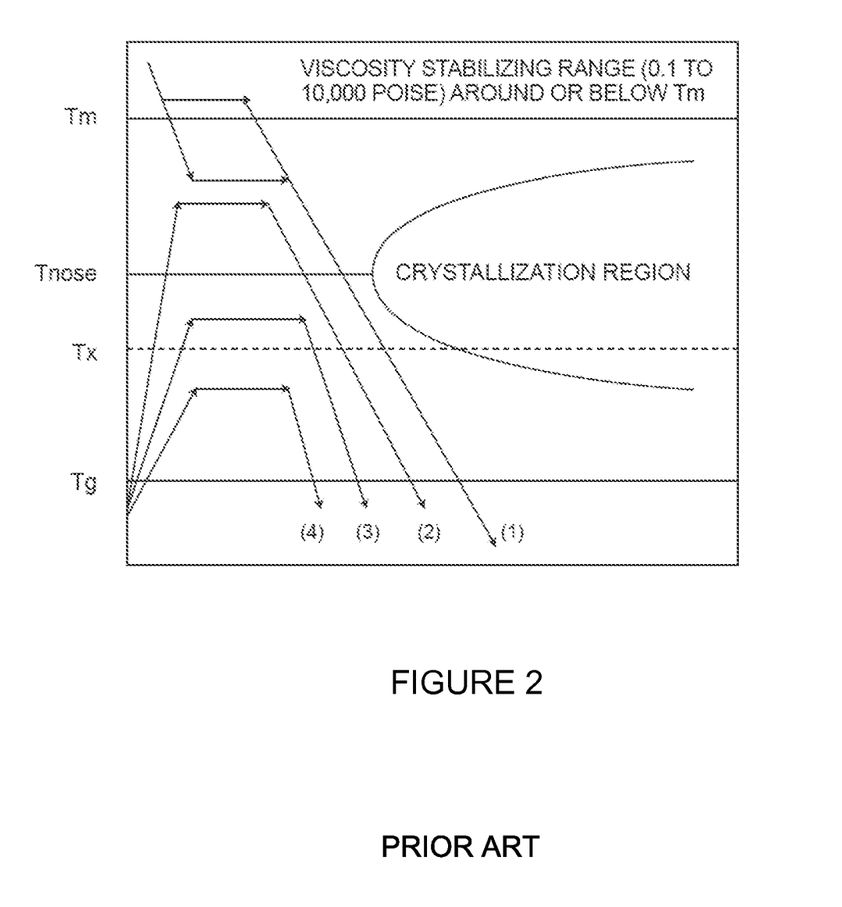
FIG. 2 provides a schematic of a time-temperature-transformation (TTT) diagram for an exemplary bulk solidifying amorphous alloy.

FIG. 2 (obtained from U.S. Pat. No. 7,575,040) shows the time-temperature-transformation (TTT) cooling curve of an exemplary bulk solidifying amorphous alloy, or TTT diagram. Bulk-solidifying amorphous metals do not experience a liquid/solid crystallization transformation upon cooling, as with conventional metals. Instead, the highly fluid, non crystalline form of the metal found at high temperatures (near a "melting temperature" Tm) becomes more viscous as the temperature is reduced (near to the glass transition temperature Tg), eventually taking on the outward physical properties of a conventional solid.

Even though there is no liquid/crystallization transformation for a bulk solidifying amorphous metal, a "melting temperature" Tm may be defined as the thermodynamic liquidus temperature of the corresponding crystalline phase. Under this regime, the viscosity of bulk-solidifying amorphous alloys at the melting temperature could lie in the range of about 0.1 poise to about 10,000 poise, and even sometimes under 0.01 poise. A lower viscosity at the "melting temperature" would provide faster and complete filling of intricate portions of the shell/mold with a bulk solidifying amorphous metal for forming the BMG parts. Furthermore, the cooling rate of the molten metal to form a BMG part has to such that the time-temperature profile during cooling does not traverse through the nose-shaped region bounding the crystallized region in the TTT diagram of FIG. 2. In FIG. 2, Tnose is the critical crystallization temperature Tx where crystallization is most rapid and occurs in the shortest time scale.

The supercooled liquid region, the temperature region between Tg and Tx is a manifestation of the extraordinary stability against crystallization of bulk solidification alloys. In this temperature region the bulk solidifying alloy can exist as a high viscous liquid. The viscosity of the bulk solidifying alloy in the supercooled liquid region can vary between $10^{12}$ Pa s at the glass transition temperature down to $10^5$ Pa s at the crystallization temperature, the high temperature limit of the supercooled liquid region. Liquids with such viscosities can undergo substantial plastic strain under an applied pressure. The embodiments herein make use of the large plastic formability in the supercooled liquid region as a forming and separating method.

One needs to clarify something about Tx. Technically, the nose-shaped curve shown in the TTT diagram describes Tx as a function of temperature and time. Thus, regardless of the trajectory that one takes while heating or cooling a metal alloy, when one hits the TTT curve, one has reached Tx. In FIG. 1 (b), Tx is shown as a dashed line as Tx can vary from close to Tm to close to Tg.

The schematic TTT diagram of FIG. 2 shows processing methods of die casting from at or above Tm to below Tg without the time-temperature trajectory (shown as (1) as an example trajectory) hitting the TTT curve. During die casting, the forming takes place substeantially simultaneously with fast cooling to avoid the trajectory hitting the TTT curve. The procssing methods for superplastic forming (SPF) from at or below Tg to below Tm without the time-temperature trajectory (shown as (2), (3) and (4) as example trajectories) hitting the TTT curve. In SPF, the amorphous BMG is reheated into the supercooled liquid region where the available processing window could be much larger than die casting, resulting in better controllability of the process. The SPF process does not require fast cooling to avoid crystallization during cooling. Also, as shown by example trajectories (2), (3) and (4), the SPF can be carried out with the highest temperature during SPF being above Tnose or below Tnose, up to about Tm. If one heats up a piece of amorphous alloy but manages to avoid hitting the TTT curve, you have heated "between Tg and Tm", but one would have not reached Tx.

Typical differential scanning calorimeter (DSC) heating curves of bulk-solidifying amorphous alloys taken at a heating rate of 20 C/min describe, for the most part, a particular trajectory across the TTT data where one would likely see a Tg at a certain temperature, a Tx when the DSC heating ramp crosses the TTT crystallization onset, and eventually melting peaks when the same trajectory crosses the temperature range for melting. If one heats a bulk-solidifying amorphous alloy at a rapid heating rate as shown by the ramp up portion of trajectories (2), (3) and (4) in FIG. 2, then one could avoid the TTT curve entirely, and the DSC data would show a glass transition but no Tx upon heating. Another way to think about it is trajectories (2), (3) and (4) can fall anywhere in temperature between the nose of the TTT curve (and even above it) and the Tg line, as long as it does not hit the crystallization curve. That just means that the horizontal plateau in trajectories might get much shorter as one increases the processing temperature.

Phase

The term "phase" herein can refer to one that can be found in a thermodynamic phase diagram. A phase is a region of space (e.g., a thermodynamic system) throughout which all physical properties of a material are essentially uniform. Examples of physical properties include density, index of refraction, chemical composition and lattice periodicity. A simple description of a phase is a region of material that is chemically uniform, physically distinct, and/or mechanically separable. For example, in a system consisting of ice and water in a glass jar, the ice cubes are one phase, the water is a second phase, and the humid air over the water is a third phase. The glass of the jar is another separate phase. A phase can refer to a solid solution, which can be a binary, tertiary, quaternary, or more, solution, or a compound, such as an intermetallic compound. As another example, an amorphous phase is distinct from a crystalline phase.

Metal, Transition Metal, and Non-Metal

The term "metal" refers to an electropositive chemical element. The term "element" in this Specification refers generally to an element that can be found in a Periodic Table. Physically, a metal atom in the ground state contains a partially filled band with an empty state close to an occupied state. The term "transition metal" is any of the metallic elements within Groups 3 to 12 in the Periodic Table that have an incomplete inner electron shell and that serve as transitional links between the most and the least electropositive in a series of elements. Transition metals are characterized by multiple valences, colored compounds, and the ability to form stable complex ions. The term "nonmetal" refers to a chemical element that does not have the capacity to lose electrons and form a positive ion.

Depending on the application, any suitable nonmetal elements, or their combinations, can be used. The alloy (or "alloy composition") can comprise multiple nonmetal elements, such as at least two, at least three, at least four, or more, nonmetal elements. A nonmetal element can be any element that is found in Groups 13-17 in the Periodic Table. For example, a nonmetal element can be any one of F, Cl, Br, I, At, O, S, Se, Te, Po, N, P, As, Sb, Bi, C, Si, Ge, Sn, Pb, and B. Occasionally, a nonmetal element can also refer to certain metalloids (e.g., B, Si, Ge, As, Sb, Te, and Po) in Groups 13-17. In one embodiment, the nonmetal elements can include B, Si, C, P, or combinations thereof. Accordingly, for example, the alloy can comprise a boride, a carbide, or both.

A transition metal element can be any of scandium, titanium, vanadium, chromium, manganese, iron, cobalt, nickel, copper, zinc, yttrium, zirconium, niobium, molybdenum, technetium, ruthenium, rhodium, palladium, silver, cadmium, hafnium, tantalum, tungsten, rhenium, osmium, iridium, platinum, gold, mercury, rutherfordium, dubnium, seaborgium, bohrium, hassium, meitnerium, ununnilium, unununium, and ununbium. In one embodiment, a BMG containing a transition metal element can have at least one of Sc, Y, La, Ac, Ti, Zr, Hf, V, Nb, Ta, Cr, Mo, W, Mn, Tc, Re, Fe, Ru, Os, Co, Rh, Ir, Ni, Pd, Pt, Cu, Ag, Au, Zn, Cd, and Hg. Depending on the application, any suitable transitional metal elements, or their combinations, can be used. The alloy composition can comprise multiple transitional metal elements, such as at least two, at least three, at least four, or more, transitional metal elements.

The presently described alloy or alloy "sample" or "specimen" alloy can have any shape or size. For example, the alloy can have a shape of a particulate, which can have a shape such as spherical, ellipsoid, wire-like, rod-like, sheet-like, flake-like, or an irregular shape. The particulate can have any size. For example, it can have an average diameter of between about 1 micron and about 100 microns, such as between about 5 microns and about 80 microns, such as between about 10 microns and about 60 microns, such as between about 15 microns and about 50 microns, such as between about 15 microns and about 45 microns, such as between about 20 microns and about 40 microns, such as between about 25 microns and about 35 microns. For example, in one embodiment, the average diameter of the particulate is between about 25 microns and about 44 microns. In some embodiments, smaller particulates, such as those in the nanometer range, or larger particulates, such as those bigger than 100 microns, can be used.

The alloy sample or specimen can also be of a much larger dimension. For example, it can be a bulk structural component, such as an ingot, housing/casing of an electronic device or even a portion of a structural component that has dimensions in the millimeter, centimeter, or meter range.

Solid Solution

The term "solid solution" refers to a solid form of a solution. The term "solution" refers to a mixture of two or more substances, which may be solids, liquids, gases, or a combination of these. The mixture can be homogeneous or heterogeneous. The term "mixture" is a composition of two or more substances that are combined with each other and are generally capable of being separated. Generally, the two or more substances are not chemically combined with each other.

Alloy

In some embodiments, the alloy composition described herein can be fully alloyed. In one embodiment, an "alloy" refers to a homogeneous mixture or solid solution of two or more metals, the atoms of one replacing or occupying interstitial positions between the atoms of the other; for example, brass is an alloy of zinc and copper. An alloy, in contrast to a composite, can refer to a partial or complete solid solution of one or more elements in a metal matrix, such as one or more compounds in a metallic matrix. The term alloy herein can refer to both a complete solid solution alloy that can give single solid phase microstructure and a partial solution that can give two or more phases. An alloy composition described herein can refer to one comprising an alloy or one comprising an alloy-containing composite.

Thus, a fully alloyed alloy can have a homogenous distribution of the constituents, be it a solid solution phase, a compound phase, or both. The term "fully alloyed" used herein can account for minor variations within the error tolerance. For example, it can refer to at least 90% alloyed, such as at least 95% alloyed, such as at least 99% alloyed, such as at least 99.5% alloyed, such as at least 99.9% alloyed. The percentage herein can refer to either volume percent or weight percentage, depending on the context. These percentages can be balanced by impurities, which can be in terms of composition or phases that are not a part of the alloy.

Amorphous or Non-Crystalline Solid

An "amorphous" or "non-crystalline solid" is a solid that lacks lattice periodicity, which is characteristic of a crystal. As used herein, an "amorphous solid" includes "glass" which is an amorphous solid that softens and transforms into a liquid-like state upon heating through the glass transition. Generally, amorphous materials lack the long-range order characteristic of a crystal, though they can possess some short-range order at the atomic length scale due to the nature of chemical bonding. The distinction between amorphous solids and crystalline solids can be made based on lattice periodicity as determined by structural characterization techniques such as x-ray diffraction and transmission electron microscopy.

The terms "order" and "disorder" designate the presence or absence of some symmetry or correlation in a many-particle system. The terms "long-range order" and "short-range order" distinguish order in materials based on length scales.

The strictest form of order in a solid is lattice periodicity: a certain pattern (the arrangement of atoms in a unit cell) is repeated again and again to form a translationally invariant tiling of space. This is the defining property of a crystal. Possible symmetries have been classified in 14 Bravais lattices and 230 space groups.

Lattice periodicity implies long-range order. If only one unit cell is known, then by virtue of the translational symmetry it is possible to accurately predict all atomic positions at arbitrary distances. The converse is generally true, except, for example, in quasi-crystals that have perfectly deterministic tilings but do not possess lattice periodicity.

Long-range order characterizes physical systems in which remote portions of the same sample exhibit correlated behavior. This can be expressed as a correlation function, namely the spin-spin correlation function: $G(x,x')=\langle s(x),s(x')\rangle$.

In the above function, s is the spin quantum number and x is the distance function within the particular system. This function is equal to unity when $x=x'$ and decreases as the distance $|x-x'|$ increases. Typically, it decays exponentially to zero at large distances, and the system is considered to be disordered. If, however, the correlation function decays to a constant value at large $|x-x'|$, then the system can be said to possess long-range order. If it decays to zero as a power of the distance, then it can be called quasi-long-range order. Note that what constitutes a large value of $|x-x'|$ is relative.

A system can be said to present quenched disorder when some parameters defining its behavior are random variables that do not evolve with time (i.e., they are quenched or frozen)—e.g., spin glasses. It is opposite to annealed disorder, where the random variables are allowed to evolve themselves. Embodiments herein include systems comprising quenched disorder.

The alloy described herein can be crystalline, partially crystalline, amorphous, or substantially amorphous. For example, the alloy sample/specimen can include at least some crystallinity, with grains/crystals having sizes in the nanometer and/or micrometer ranges. Alternatively, the alloy can be substantially amorphous, such as fully amorphous. In one embodiment, the alloy composition is at least substantially not amorphous, such as being substantially crystalline, such as being entirely crystalline.

In one embodiment, the presence of a crystal or a plurality of crystals in an otherwise amorphous alloy can be construed as a "crystalline phase" therein. The degree of crystallinity (or "crystallinity" for short in some embodiments) of an alloy can refer to the amount of the crystalline phase present in the alloy. The degree can refer to, for example, a fraction of crystals present in the alloy. The fraction can refer to volume fraction or weight fraction, depending on the context. A measure of how "amorphous" an amorphous alloy is can be amorphicity. Amorphicity can be measured in terms of a degree of crystallinity. For example, in one embodiment, an alloy having a low degree of crystallinity can be said to have a high degree of amorphicity. In one embodiment, for example, an alloy having 60 vol % crystalline phase can have a 40 vol % amorphous phase.

Amorphous Alloy or Amorphous Metal

An "amorphous alloy" is an alloy having an amorphous content of more than 50% by volume, preferably more than 90% by volume of amorphous content, more preferably more than 95% by volume of amorphous content, and most preferably more than 99% to almost 100% by volume of amorphous content. Note that, as described above, an alloy high in amorphicity is equivalently low in degree of crystallinity. An "amorphous metal" is an amorphous metal material with a disordered atomic-scale structure. In contrast to most metals, which are crystalline and therefore have a highly ordered arrangement of atoms, amorphous alloys are non-crystalline. Materials in which such a disordered structure is produced directly from the liquid state during cooling are sometimes referred to as "glasses." Accordingly, amorphous metals are commonly referred to as "metallic glasses" or "glassy metals." In one embodiment, a bulk metallic glass ("BMG") can refer to an alloy, of which the microstructure is at least partially amorphous. However, there are several ways besides extremely rapid cooling to produce amorphous metals, including physical vapor deposition, solid-state reaction, ion irradiation, melt spinning, and mechanical alloying. Amorphous alloys can be a single class of materials, regardless of how they are prepared.

Amorphous metals can be produced through a variety of quick-cooling methods. For instance, amorphous metals can be produced by sputtering molten metal onto a spinning metal disk. The rapid cooling, on the order of millions of degrees a second, can be too fast for crystals to form, and the material is thus "locked in" a glassy state. Also, amorphous metals/alloys can be produced with critical cooling rates low enough to allow formation of amorphous structures in thick layers—e.g., bulk metallic glasses.

The terms "bulk metallic glass" ("BMG"), bulk amorphous alloy ("BAA"), and bulk solidifying amorphous alloy are used interchangeably herein. They refer to amorphous alloys having the smallest dimension at least in the millimeter range. For example, the dimension can be at least about 0.5 mm, such as at least about 1 mm, such as at least about 2 mm, such as at least about 4 mm, such as at least about 5 mm, such as at least about 6 mm, such as at least about 8 mm, such as at least about 10 mm, such as at least about 12 mm Depending on the geometry, the dimension can refer to the diameter, radius, thickness, width, length, etc. A BMG can also be a metallic glass having at least one dimension in the centimeter range, such as at least about 1.0 cm, such as at least about 2.0 cm, such as at least about 5.0 cm, such as at least about 10.0 cm. In some embodiments, a BMG can have at least one dimension at least in the meter range. A BMG can take any of the shapes or forms described above, as related to a metallic glass. Accordingly, a BMG described herein in some embodiments can be different from a thin film made by a conventional deposition technique in one important aspect—the former can be of a much larger dimension than the latter.

Amorphous metals can be an alloy rather than a pure metal. The alloys may contain atoms of significantly different sizes, leading to low free volume (and therefore having viscosity up to orders of magnitude higher than other metals and alloys) in a molten state. The viscosity prevents the atoms from moving enough to form an ordered lattice. The material structure may result in low shrinkage during cooling and resistance to plastic deformation. The absence of grain boundaries, the weak spots of crystalline materials in some cases, may, for example, lead to better resistance to wear and corrosion. In one embodiment, amorphous metals, while technically glasses, may also be much tougher and less brittle than oxide glasses and ceramics.

Thermal conductivity of amorphous materials may be lower than that of their crystalline counterparts. To achieve formation of an amorphous structure even during slower cooling, the alloy may be made of three or more components, leading to complex crystal units with higher potential energy and lower probability of formation. The formation of amorphous alloy can depend on several factors: the composition of the components of the alloy; the atomic radius of the components (preferably with a significant difference of over 12% to achieve high packing density and low free volume); and the negative heat of mixing the combination of components, inhibiting crystal nucleation and prolonging the time the molten metal stays in a supercooled state. However, as the formation of an amorphous alloy is based on many different variables, it can be difficult to make a prior determination of whether an alloy composition would form an amorphous alloy.

Amorphous alloys, for example, of boron, silicon, phosphorus, and other glass formers with magnetic metals (iron, cobalt, nickel) may be magnetic, with low coercivity and high electrical resistance. The high resistance leads to low losses by eddy currents when subjected to alternating magnetic fields, a property useful, for example, as transformer magnetic cores.

Amorphous alloys may have a variety of potentially useful properties. In particular, they tend to be stronger than crystalline alloys of similar chemical composition, and they can sustain larger reversible ("elastic") deformations than crystalline alloys. Amorphous metals derive their strength directly from their non-crystalline structure, which can have none of the defects (such as dislocations) that limit the strength of crystalline alloys. For example, one modern amorphous metal, known as Vitreloy™, has a tensile strength that is almost twice that of high-grade titanium. In some embodiments, metallic glasses at room temperature are not ductile and tend to fail suddenly when loaded in tension, which limits the material applicability in reliability-critical applications, as the impending failure is not evident. Therefore, to overcome this challenge, metal matrix composite materials having a metallic glass matrix containing dendritic particles or fibers of a ductile crystalline metal can be used. Alternatively, a BMG low in element(s) that tend to cause embitterment (e.g., Ni) can be used. For example, a Ni-free BMG can be used to improve the ductility of the BMG.

Another useful property of bulk amorphous alloys is that they can be true glasses; in other words, they can soften and flow upon heating. This can allow for easy processing, such as by injection molding, in much the same way as polymers. As a result, amorphous alloys can be used for making sports equipment, medical devices, electronic components and equipment, and thin films. Thin films of amorphous metals can be deposited as protective coatings via a high velocity oxygen fuel technique.

A material can have an amorphous phase, a crystalline phase, or both. The amorphous and crystalline phases can have the same chemical composition and differ only in the microstructure—i.e., one amorphous and the other crystalline. Microstructure in one embodiment refers to the structure of a material as revealed by a microscope at 25× magnification or higher. Alternatively, the two phases can have different chemical compositions and microstructures. For example, a composition can be partially amorphous, substantially amorphous, or completely amorphous.

As described above, the degree of amorphicity (and conversely the degree of crystallinity) can be measured by fraction of crystals present in the alloy. The degree can refer to volume fraction of weight fraction of the crystalline phase present in the alloy. A partially amorphous composition can refer to a composition of at least about 5 vol % of which is of an amorphous phase, such as at least about 10 vol %, such as at least about 20 vol %, such as at least about 40 vol %, such as at least about 60 vol %, such as at least about 80 vol %, such as at least about 90 vol %. The terms "substantially" and "about" have been defined elsewhere in this application. Accordingly, a composition that is at least substantially amorphous can refer to one of which at least about 90 vol % is amorphous, such as at least about 95 vol %, such as at least about 98 vol %, such as at least about 99 vol %, such as at least about 99.5 vol %, such as at least about 99.8 vol %, such as at least about 99.9 vol %. In one embodiment, a substantially amorphous composition can have some incidental, insignificant amount of crystalline phase present therein.

In one embodiment, an amorphous alloy composition can be homogeneous with respect to the amorphous phase. A substance that is uniform in composition is homogeneous. This is in contrast to a substance that is heterogeneous. The term "composition" refers to the chemical composition and/or microstructure in the substance. A substance is homogeneous when a volume of the substance is divided in half and both halves have substantially the same composition. For example, a particulate suspension is homogeneous when a volume of the particulate suspension is divided in half and both halves have substantially the same volume of particles. However, it might be possible to see the individual particles under a microscope. Another example of a homogeneous substance is air where different ingredients therein are equally suspended, though the particles, gases and liquids in air can be analyzed separately or separated from air.

A composition that is homogeneous with respect to an amorphous alloy can refer to one having an amorphous phase substantially uniformly distributed throughout its microstructure. In other words, the composition macroscopically comprises a substantially uniformly distributed amorphous alloy throughout the composition. In an alternative embodiment, the composition can be of a composite, having an amorphous phase having therein a non-amorphous phase. The non-amorphous phase can be a crystal or a plurality of crystals. The crystals can be in the form of particulates of any shape, such as spherical, ellipsoid, wire-like, rod-like, sheet-like, flake-like, or an irregular shape. In one embodiment, it can have a dendritic form. For example, an at least partially amorphous composite composition can have a crystalline phase in the shape of dendrites dispersed in an amorphous phase matrix; the dispersion can be uniform or non-uniform, and the amorphous phase and the crystalline phase can have the same or a different chemical composition. In one embodiment, they have substantially the same chemical composition. In another embodiment, the crystalline phase can be more ductile than the BMG phase.

The methods described herein can be applicable to any type of amorphous alloy. Similarly, the amorphous alloy described herein as a constituent of a composition or article can be of any type. The amorphous alloy can comprise the element Zr, Hf, Ti, Cu, Ni, Pt, Pd, Fe, Mg, Au, La, Ag, Al, Mo, Nb, Be, or combinations thereof. Namely, the alloy can include any combination of these elements in its chemical formula or chemical composition. The elements can be present at different weight or volume percentages. For example, an iron "based" alloy can refer to an alloy having a non-insignificant weight percentage of iron present therein, the weight percent can be, for example, at least about 20 wt %, such as at least about 40 wt %, such as at least about 50 wt %, such as at least about 60 wt %, such as at least about 80 wt %. Alternatively, in one embodiment, the above-described percentages can be volume percentages, instead of weight percentages. Accordingly, an amorphous alloy can be zirconium-based, titanium-based, platinum-based, palladium-based, gold-based, silver-based, copper-based, iron-based, nickel-based, aluminum-based, molybdenum-based, and the like. The alloy can also be free of any of the aforementioned elements to suit a particular purpose. For example, in some embodiments, the alloy, or the composition including the alloy, can be substantially free of nickel, aluminum, titanium, beryllium, or combinations thereof. In one embodiment, the alloy or the composite is completely free of nickel, aluminum, titanium, beryllium, or combinations thereof.

For example, the amorphous alloy can have the formula $(Zr, Ti)_a(Ni, Cu, Fe)_b(Be, Al, Si, B)_c$, wherein a, b, and c each represents a weight or atomic percentage. In one embodiment, a is in the range of from 30 to 75, b is in the range of from 5 to 60, and c is in the range of from 0 to 50 in atomic percentages. Alternatively, the amorphous alloy can have the formula $(Zr, Ti)_a(Ni, Cu)_b(Be)_c$, wherein a, b, and c each represents a weight or atomic percentage. In one embodiment, a is in the range of from 40 to 75, b is in the range of from 5 to 50, and c is in the range of from 5 to 50 in atomic percentages. The alloy can also have the formula $(Zr, Ti)_a(Ni, Cu)_b(Be)_c$, wherein a, b, and c each represents a weight or atomic percentage. In one embodiment, a is in the range of from 45 to 65, b is in the range of from 7.5 to 35, and c is in the range of from 10 to 37.5 in atomic percentages. Alternatively, the alloy can have the formula $(Zr)_a(Nb, Ti)_b(Ni, Cu)_c(Al)_d$, wherein a, b, c, and d each represents a weight or atomic percentage. In one embodiment, a is in the range of from 45 to 65, b is in the range of from 0 to 10, c is in the range of from 20 to 40 and d is in the range of from 7.5 to 15 in atomic percentages. One exemplary embodiment of the afore-described alloy system is a Zr—Ti—Ni—Cu—Be based amorphous alloy under the trade name Vitreloy™ such as Vitreloy-1 and Vitreloy-101, as fabricated by Liquidmetal Technologies, CA, USA. Some examples of amorphous alloys of the different systems are provided in Table 1.

The amorphous alloys can also be ferrous alloys, such as (Fe, Ni, Co) based alloys. Examples of such compositions are disclosed in U.S. Pat. Nos. 6,325,868; 5,288,344; 5,368,659; 5,618,359; and 5,735,975, Inoue et al., Appl. Phys. Lett., Volume 71, p 464 (1997), Shen et al., Mater. Trans., JIM, Volume 42, p 2136 (2001), and Japanese Patent Application No. 200126277 (Pub. No. 2001303218 A). One exemplary composition is $Fe_{72}Al_5Ga_2P_{11}C_6B_4$. Another example is $Fe_{72}Al_7Zr_{10}Mo_5W_2B_{15}$. Another iron-based alloy system that can be used in the coating herein is disclosed in U.S. Patent Application Publication No. 2010/0084052, wherein the amorphous metal contains, for example, manganese (1 to 3 atomic %), yttrium (0.1 to 10 atomic %), and silicon (0.3 to 3.1 atomic %) in the range of composition given in parentheses; and that contains the following elements in the specified range of composition given in parentheses: chromium (15 to 20 atomic %), molybdenum (2 to 15 atomic %), tungsten (1 to 3 atomic %), boron (5 to 16 atomic %), carbon (3 to 16 atomic %), and the balance iron.

The aforedescribed amorphous alloy systems can further include additional elements, such as additional transition metal elements, including Nb, Cr, V, and Co. The additional elements can be present at less than or equal to about 30 wt %, such as less than or equal to about 20 wt %, such as less than or equal to about 10 wt %, such as less than or equal to about 5 wt %. In one embodiment, the additional, optional element is at least one of cobalt, manganese, zirconium, tantalum, niobium, tungsten, yttrium, titanium, vanadium and hafnium to form carbides and further improve wear and corrosion resistance. Further optional elements may include phosphorous, germanium and arsenic, totaling up to about 2%, and preferably less than 1%, to reduce melting point. Otherwise incidental impurities should be less than about 2% and preferably 0.5%.

TABLE 1

Exemplary amorphous alloy compositions

| Alloy | Atm % | Atm % | Atm % | Atm % | Atm % | Atm % |
|---|---|---|---|---|---|---|
| 1 | Zr | Ti | Cu | Ni | Be | |
| | 41.20% | 13.80% | 12.50% | 10.00% | 22.50% | |
| 2 | Zr | Ti | Cu | Ni | Be | |
| | 44.00% | 11.00% | 10.00% | 10.00% | 25.00% | |
| 3 | Zr | Ti | Cu | Ni | Nb | Be |
| | 56.25% | 11.25% | 6.88% | 5.63% | 7.50% | 12.50% |
| 4 | Zr | Ti | Cu | Ni | Al | Be |
| | 64.75% | 5.60% | 14.90% | 11.15% | 2.60% | 1.00% |
| 5 | Zr | Ti | Cu | Ni | Al | |
| | 52.50% | 5.00% | 17.90% | 14.60% | 10.00% | |
| 6 | Zr | Nb | Cu | Ni | Al | |
| | 57.00% | 5.00% | 15.40% | 12.60% | 10.00% | |
| 7 | Zr | Cu | Ni | Al | Sn | |
| | 50.75% | 36.23% | 4.03% | 9.00% | 0.50% | |
| 8 | Zr | Ti | Cu | Ni | Be | |
| | 46.75% | 8.25% | 7.50% | 10.00% | 27.50% | |
| 9 | Zr | Ti | Ni | Be | | |
| | 21.67% | 43.33% | 7.50% | 27.50% | | |
| 10 | Zr | Ti | Cu | Be | | |
| | 35.00% | 30.00% | 7.50% | 27.50% | | |
| 11 | Zr | Ti | Co | Be | | |
| | 35.00% | 30.00% | 6.00% | 29.00% | | |
| 12 | Au | Ag | Pd | Cu | Si | |
| | 49.00% | 5.50% | 2.30% | 26.90% | 16.30% | |
| 13 | Au | Ag | Pd | Cu | Si | |
| | 50.90% | 3.00% | 2.30% | 27.80% | 16.00% | |
| 14 | Pt | Cu | Ni | P | | |
| | 57.50% | 14.70% | 5.30% | 22.50% | | |
| 15 | Zr | Ti | Nb | Cu | Be | |
| | 36.60% | 31.40% | 7.00% | 5.90% | 19.10% | |
| 16 | Zr | Ti | Nb | Cu | Be | |
| | 38.30% | 32.90% | 7.30% | 6.20% | 15.30% | |
| 17 | Zr | Ti | Nb | Cu | Be | |
| | 39.60% | 33.90% | 7.60% | 6.40% | 12.50% | |
| 18 | Cu | Ti | Zr | Ni | | |

TABLE 1-continued

Exemplary amorphous alloy compositions

| Alloy | Atm % | Atm % | Atm % | Atm % | Atm % | Atm % |
|---|---|---|---|---|---|---|
| 19 | 47.00% Zr 55.00% | 34.00% Co 25.00% | 11.00% Al 20.00% | 8.00% | | |

In some embodiments, a composition having an amorphous alloy can include a small amount of impurities. The impurity elements can be intentionally added to modify the properties of the composition, such as improving the mechanical properties (e.g., hardness, strength, fracture mechanism, etc.) and/or improving the corrosion resistance. Alternatively, the impurities can be present as inevitable, incidental impurities, such as those obtained as a byproduct of processing and manufacturing. The impurities can be less than or equal to about 10 wt %, such as about 5 wt %, such as about 2 wt %, such as about 1 wt %, such as about 0.5 wt %, such as about 0.1 wt %. In some embodiments, these percentages can be volume percentages instead of weight percentages. In one embodiment, the alloy sample/composition consists essentially of the amorphous alloy (with only a small incidental amount of impurities). In another embodiment, the composition includes the amorphous alloy (with no observable trace of impurities).

In one embodiment, the final parts exceeded the critical casting thickness of the bulk solidifying amorphous alloys.

In embodiments herein, the existence of a supercooled liquid region in which the bulk-solidifying amorphous alloy can exist as a high viscous liquid allows for superplastic forming. Large plastic deformations can be obtained. The ability to undergo large plastic deformation in the supercooled liquid region is used for the forming and/or cutting process. As oppose to solids, the liquid bulk solidifying alloy deforms locally which drastically lowers the required energy for cutting and forming. The ease of cutting and forming depends on the temperature of the alloy, the mold, and the cutting tool. As higher is the temperature, the lower is the viscosity, and consequently easier is the cutting and forming.

Embodiments herein can utilize a thermoplastic-forming process with amorphous alloys carried out between Tg and Tx, for example. Herein, Tx and Tg are determined from standard DSC measurements at typical heating rates (e.g. 20° C./min) as the onset of crystallization temperature and the onset of glass transition temperature.

The amorphous alloy components can have the critical casting thickness and the final part can have thickness that is thicker than the critical casting thickness. Moreover, the time and temperature of the heating and shaping operation is selected such that the elastic strain limit of the amorphous alloy could be substantially preserved to be not less than 1.0%, and preferably not being less than 1.5%. In the context of the embodiments herein, temperatures around glass transition means the forming temperatures can be below glass transition, at or around glass transition, and above glass transition temperature, but preferably at temperatures below the crystallization temperature $T_x$. The cooling step is carried out at rates similar to the heating rates at the heating step, and preferably at rates greater than the heating rates at the heating step. The cooling step is also achieved preferably while the forming and shaping loads are still maintained.

Electronic Devices

The embodiments herein can be valuable in the fabrication of electronic devices using a BMG. An electronic device herein can refer to any electronic device known in the art. For example, it can be a telephone, such as a cell phone, and a land-line phone, or any communication device, such as a smart phone, including, for example an iPhone™, and an electronic email sending/receiving device. It can be a part of a display, such as a digital display, a TV monitor, an electronic-book reader, a portable web-browser (e.g., iPad™), and a computer monitor. It can also be an entertainment device, including a portable DVD player, conventional DVD player, Blue-Ray disk player, video game console, music player, such as a portable music player (e.g., iPod™), etc. It can also be a part of a device that provides control, such as controlling the streaming of images, videos, sounds (e.g., Apple TV™), or it can be a remote control for an electronic device. It can be a part of a computer or its accessories, such as the hard drive tower housing or casing, laptop housing, laptop keyboard, laptop track pad, desktop keyboard, mouse, and speaker. The article can also be applied to a device such as a watch or a clock.

A large-area metal sheet is a useful form for manufacture. It could be welded to form parts such as cases, enclosures or tanks. It could be cut (e.g., water-jet or laser) into parts such as springs, plates, rings, etc. It could also be useful as feedstock for processes such as blow molding, thermoplastic forming or coining, etc.

Making BMG in to a large-area sheet poses certain unique challenges due to the properties of BMG. For example, if the process of making BMG into a large-area sheet involves too much heating (especially when the large-area sheet is thin), the sheet may cease to be essentially amorphous. Minimizing the thermal history of such a process has to involve would increase the amount of time available to a downstream operation that uses the sheet to make parts before the sheet loses its amorphousness.

Spin coating is a process to apply uniform thin films to a substrate. In the spin coating process, a liquid is placed on the substrate, which is then rotated at high speed to spread the liquid by centrifugal force. A machine used for spin coating is called a spin coater, or simply spinner. Rotation may be continued while the liquid spins off the edges of the substrate, until the desired thickness of the film is achieved. The higher the angular speed of spinning, the thinner the film. The thickness of the film also depends on the viscosity of the liquid and the duration the spinning Spin coating is widely used in microfabrication, where it can be used to create thin films with thicknesses below 10 nm. It is used intensively in photolithography, to deposit layers of photoresist about 1 micrometer thick. Photoresist is typically spun at 20 to 80 revolutions per second for 30 to 60 seconds.

Similar spinning technique as that for making crown glass can be used for BMG sheets. In one embodiment, the process of making BMG sheets made by the spinning process could be called a "crown glass" process. In this process, a BMG sheet can be formed into a "crown" or hollow globe, and then transferred from the blowpipe to a punty and then flattened by reheating and spinning out the bowl-shaped piece of the BMG (bullion) into a flat disk by centrifugal force, up to 5 or 6 feet (1.5 to 1.8 m) in diameter. The disk can then be cut to the size required.

Figure 3A:
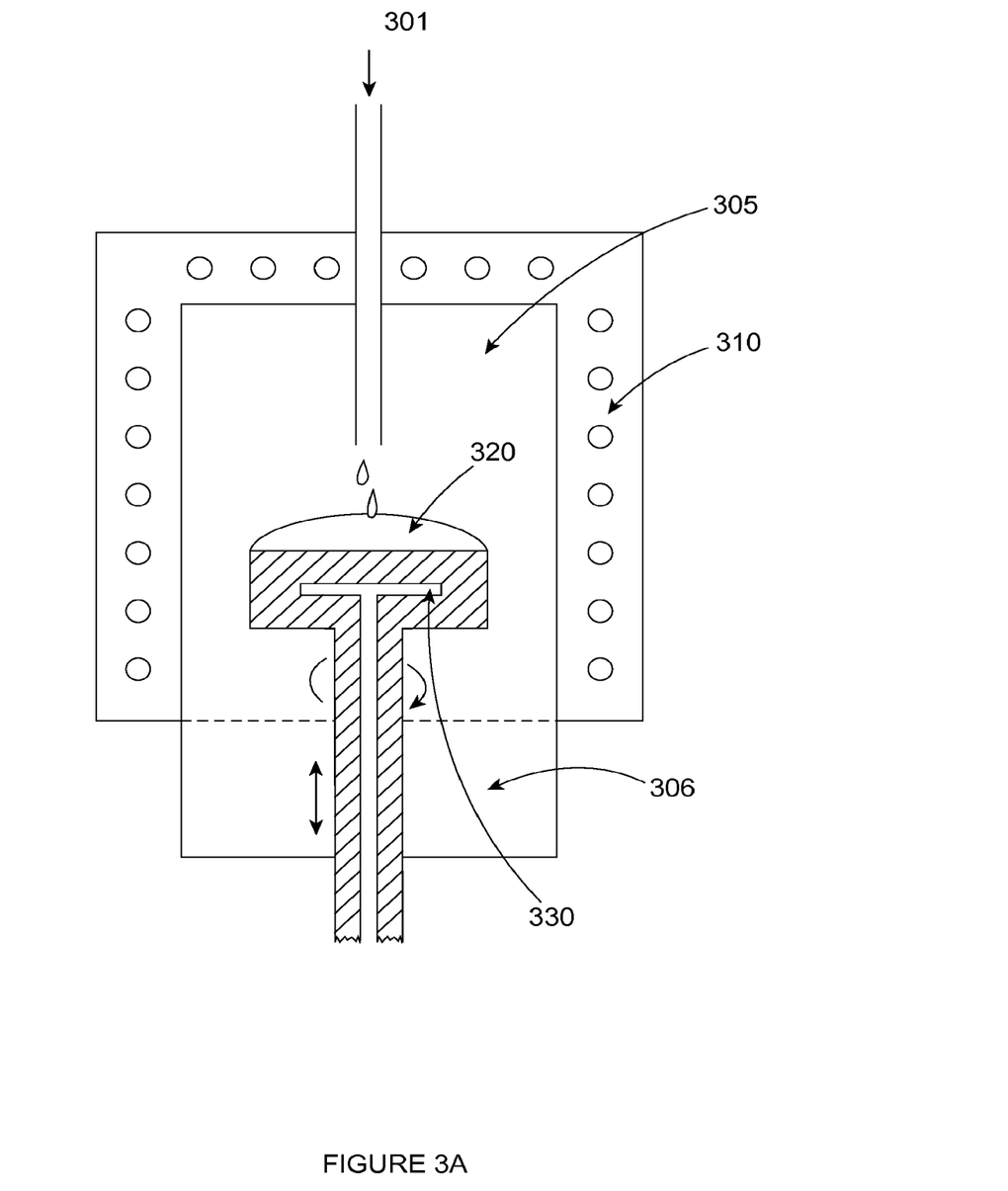
FIG. 3A shows a device according to an embodiment.

In an embodiment illustrated in FIG. 3A, a device configured to making BMG sheets by spinning comprises a vacuum chamber. The vacuum chamber may be divided into a heated region 305 and an unheated region 306. The device comprises a mechanism such as a conduit 301, configured to feed BMG in a molten state onto a spinning stage 320. The conduit 301 may comprise a ceramic or graphite funnel surrounded by an induction coil. The BMG in a molten state is maintained in the molten state when the spinning stage 320 is in the heated region 305. The heated region 305 may be heated by any suitable method sufficient to maintain a temperature at which the BMG is molten. For example, induction coils 310 may be used to inductively heat the BMG in a molten state on the spinning stage 320. The spinning stage 320 is configured to spin at a speed sufficient to spread the BMG in a molten state on the spinning stage 320 into a BMG sheet by centrifugal force. The spinning stage 320 may also be configured to move from the heated region 305 into the unheated region 306 to cool the BMG sheet. Alternatively, the spinning stage may remain in the heated region 305 and the heating is turned off to cool the BMG sheet. In an embodiment, the spinning stage 320 comprises a high thermal conductivity ceramic, chrome and/or chromium0nitride coated copper. The spinning stage 320 may comprise conduits 330 configured to accommodate cooling fluids. The cooling fluids can cool and solidify the BMG sheet on the spinning stage at a rate at which the BMG sheet remains amorphous after solidification. The spinning stage 320 is preferably able to withstand high temperatures up to about 1000° C.

The thickness of the BMG sheet can be estimated as $a/\omega\sqrt{t}$, where $\omega$ is the angular velocity of the spinning stage 320, t is the duration of the spinning and a is an empirical constant.

Figure 3B:
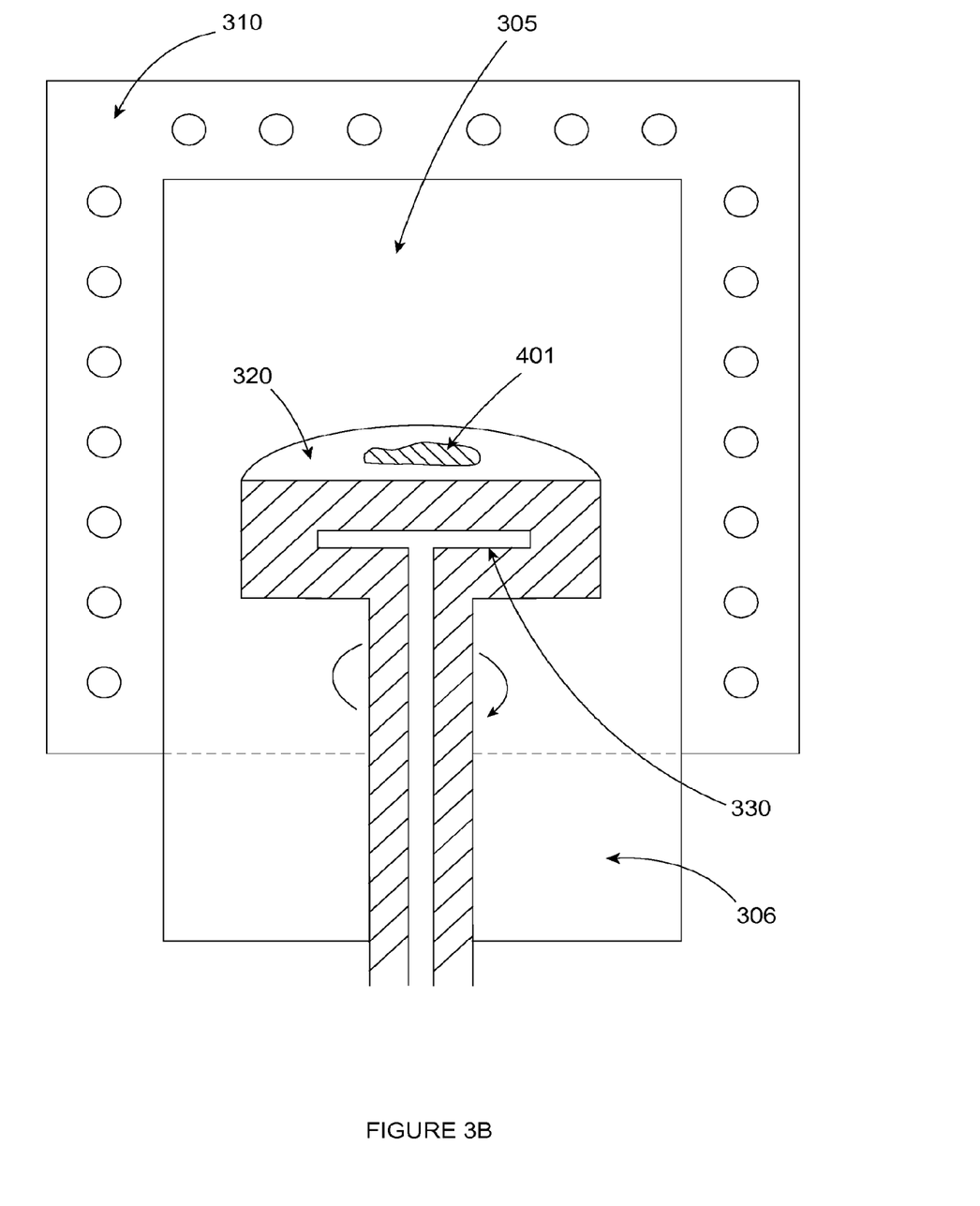
FIG. 3B shows a device according to an embodiment.

In an alternative setup illustrated in FIG. 3B, instead of feeding BMG in a molten state onto the spinning stage 320, a BMG feedstock 401 in solid form is placed on the spinning stage and the BMG feedstock is melted on the stage before being spun into a BMG sheet. The BMG feedstock 401 could be a bar, rod, or powder of BMG or a composite of materials that form a BMG through melting of the BMG feedstock 401.

Figure 4:
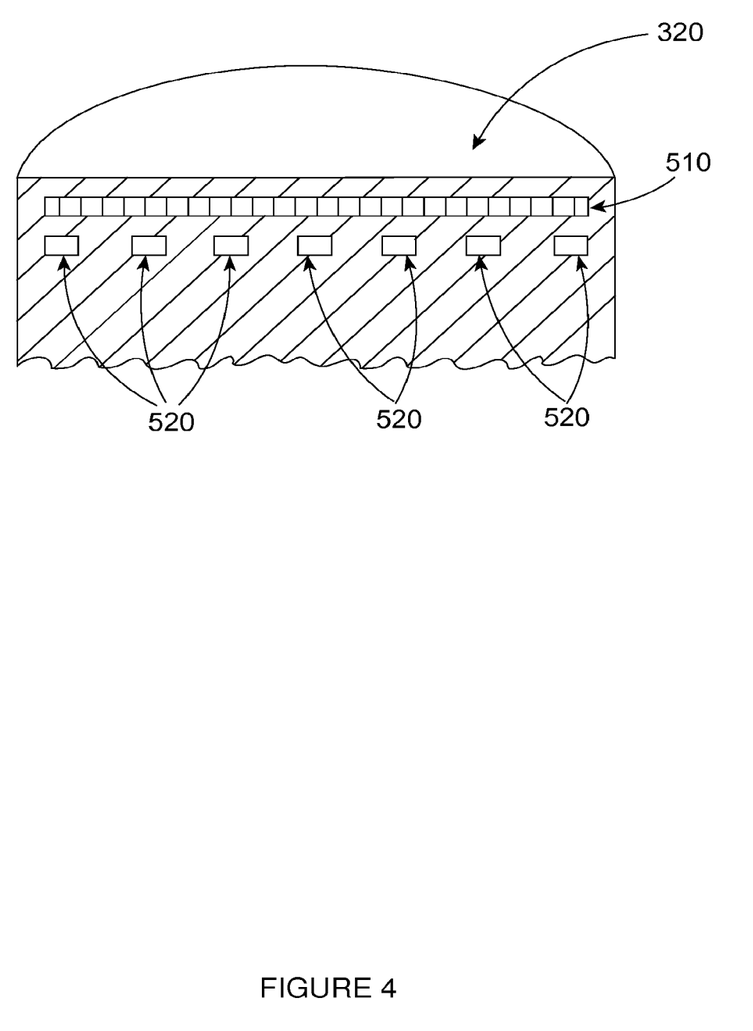
FIG. 4 shows the stage that could be used in the device of FIG. 3A or 3B, according to an embodiment.

In an embodiment illustrated in FIG. 4, the spinning stage 320 may comprise conduits 520 configured to accommodate cooling fluids. The cooling fluids can cool and solidify the BMG sheet on the spinning stage at a rate at which the BMG sheet remains amorphous after solidification. The spinning stage 320 may comprises a heater 510 configured to melt the BMG feedstock 401 and/or keep any BMG on the spinning stage 320 in the molten state during the spinning.

Figure 5:
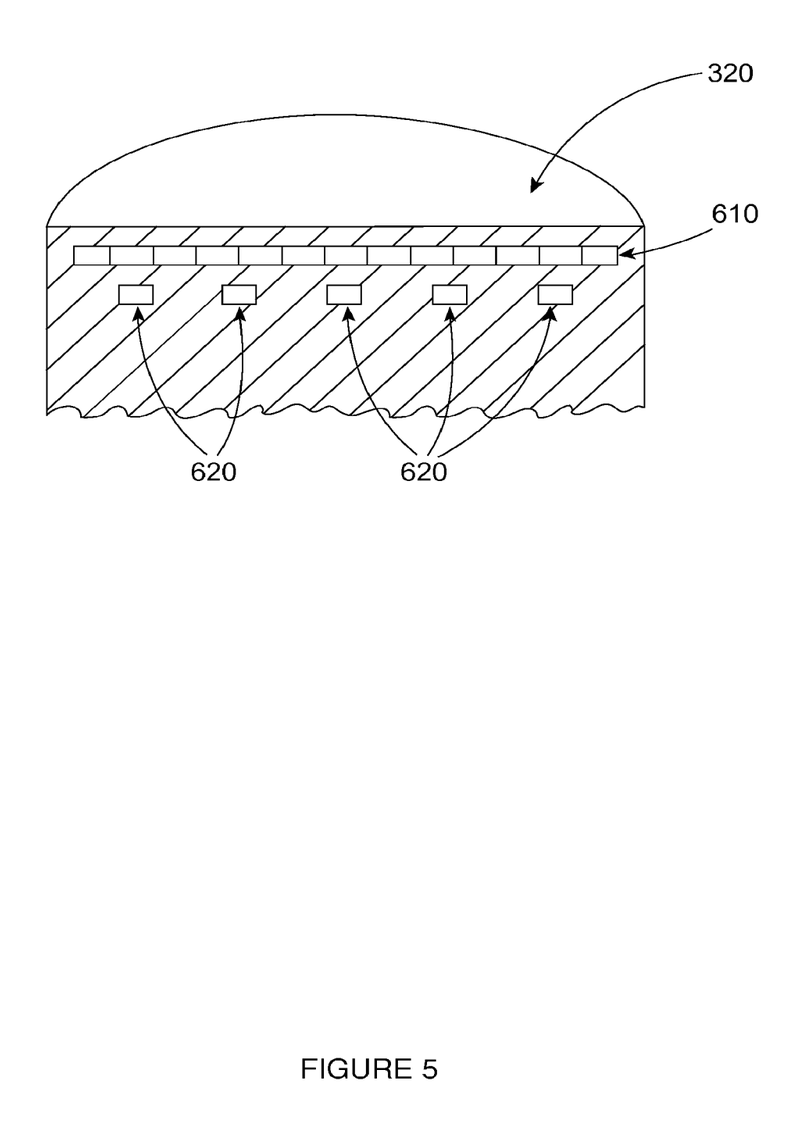
FIG. 5 shows the stage that could be used in the device of FIG. 3A or 3B, according to an embodiment.

In an embodiment illustrated in FIG. 5, the spinning stage 320 may comprise an electrostatic clamp 610 configured to clamp a substrate (e.g., silicon, ceramic) onto the spinning stage 320 so that the BMG sheet forms on the substrate.

Figure 6:
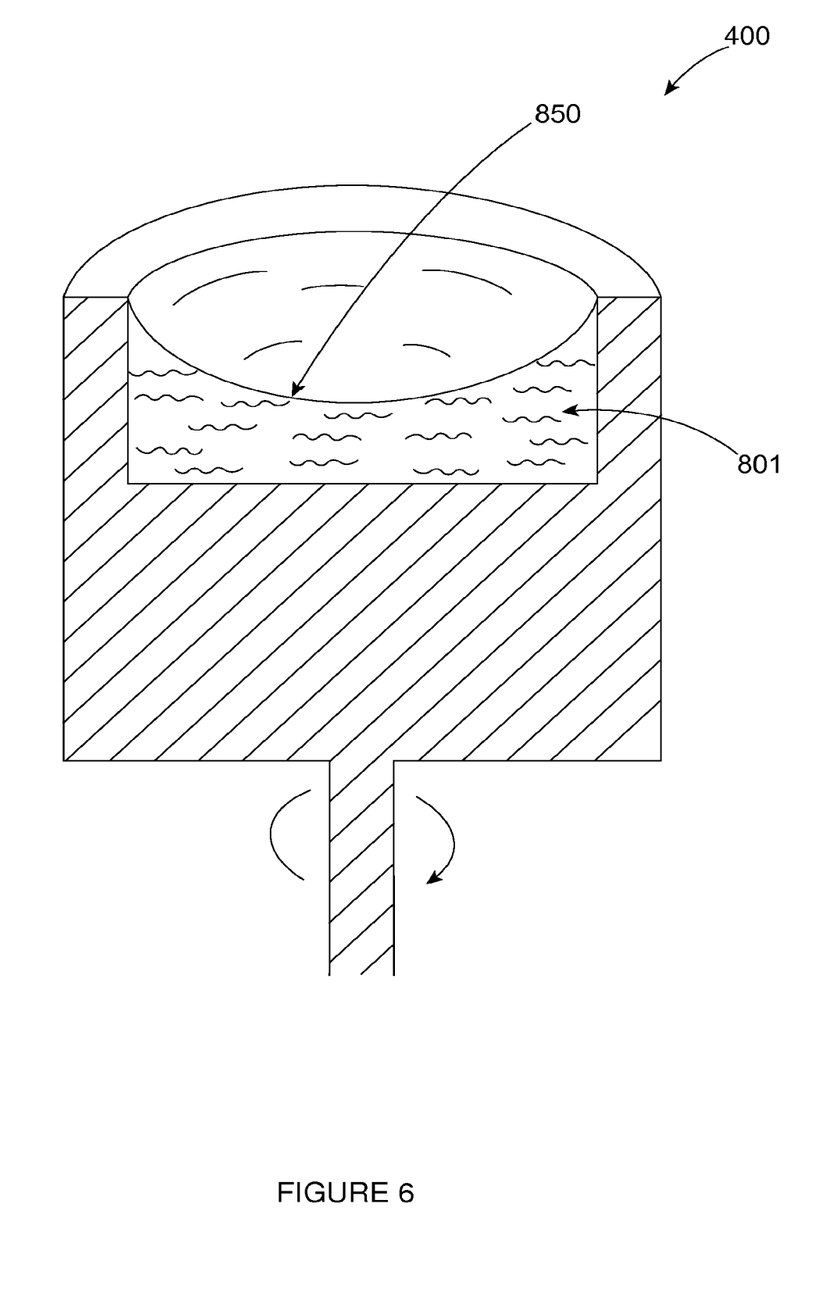
FIG. 6 shows the stage that could be used in the device of FIG. 3A or 3B, according to an embodiment.

In an embodiment illustrated in FIG. 6, a spinning stage 400 may have a cavity configured to accommodate a volume of BMG in a molten state 801. As the spinning stage 400 spins, the BMG in a molten state 801 forms an essentially parabolic surface 850. The BMG in a molten state 801 can be cooled to the solid state while the spinning stage 400 spins. The parabolic surface 850 is thus retained in the solid state. The parabolic surface 850 of the BMG may be configured as a mirror for use in an optical system.

Figure 7:
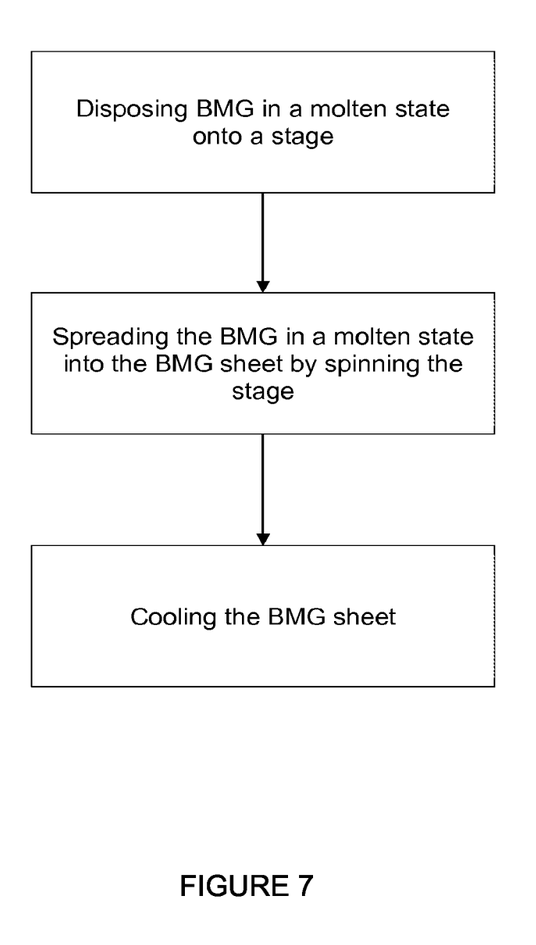
FIG. 7 is a flow chart depicting a method of forming a bulk solidifying amorphous alloy sheet according to an embodiment.

A method of forming a BMG sheet is shown in the flow chart of FIG. 7. The method includes: disposing BMG in a molten state onto a stage; spreading the BMG in a molten state into the BMG sheet by spinning the stage; cooling the BMG sheet.

In an embodiment, the BMG is essentially free of iron. In an embodiment, the BMG is essentially free of nickel. In an embodiment, the BMG is essentially free of cobalt. In an embodiment, the BMG is essentially free of gold, silver and platinum. In an embodiment the BMG is not ferromagnetic. In an embodiment, the BMG is a composition listed in Table 1.

While the invention is described and illustrated here in the context of a limited number of embodiments, the invention may be embodied in many forms without departing from the spirit of the essential characteristics of the invention. The illustrated and described embodiments, including what is described in the abstract of the disclosure, are therefore to be considered in all respects as illustrative and not restrictive. The scope of the invention is indicated by the appended claims rather than by the foregoing description, and all changes that come within the meaning and range of equivalency of the claims are intended to be embraced therein.

I claim:

1. A method of forming a solid bulk metallic glass (BMG) sheet, comprising:
   disposing molten BMG onto a stage;
   spinning the stage to spread the molten BMG; and
   cooling the molten BMG to form a solid BMG sheet.

2. The method of claim 1, wherein the operation of disposing the molten BMG onto the stage comprises:
   disposing a solid BMG feedstock onto the stage; and
   melting the solid BMG feedstock.

3. The method of claim 1, further comprising subjecting the stage to a vacuum environment in a vacuum chamber.

4. The method of claim 1, wherein the operation of cooling the molten BMG comprises flowing a cooling fluid through a conduit in the stage.

5. The method of claim 1, wherein the operation of cooling the molten BMG comprises cooling the molten BMG at a rate that results in at which the solid BMG sheet having an amorphous microstructure after solidification.

6. The method of claim 1, wherein the operation of cooling the molten BMG occurs while the stage is spinning.

7. The method of claim 1, wherein the operation of disposing the molten BMG onto the stage comprises disposing the molten BMG in a cavity defined by the stage and configured to accommodate the molten BMG.

8. The method of claim 1, wherein the operation of spinning the stage to spread the molten BMG comprises forming the molten BMG into a shape having an essentially parabolic surface.

9. A method of forming a component comprising a bulk metallic glass (BMG), comprising:
   disposing a substrate onto a stage;
   disposing molten BMG onto the substrate; and
   spinning the stage to spread the molten BMG over a surface of the substrate.

10. The method of claim 9, further comprising, after disposing the substrate onto the stage, activating an electrostatic clamp to clamp the substrate to the stage.

11. The method of claim 9, further comprising cooling the molten BMG to form a solid BMG sheet on the substrate.

12. The method of claim 9, wherein the substrate comprises a ceramic material.

13. The method of claim 9, wherein the operation of disposing the molten BMG onto the substrate comprises flowing the molten BMG through a conduit surrounded by an induction coil.

14. A method of forming a solid bulk metallic glass (BMG) sheet, comprising:
   disposing a BMG feedstock on a stage;
   activating a heater associated with the stage to melt the BMG feedstock, thereby forming a molten BMG;
   spinning the stage to spread the molten BMG; and
   flowing a fluid through a conduit to cool the molten BMG, thereby forming a solid BMG sheet.

15. The method of claim 14, wherein the operation of activating the heater comprises activating a heater disposed within the stage.

16. The method of claim 14, wherein the operation of activating the heater comprises activating an induction coil surrounding the stage.

17. The method of claim 14, further comprising, prior to flowing the fluid through the conduit, moving the stage from a heated region into an unheated region.

18. The method of claim 14, further comprising, prior to flowing the fluid through the conduit, deactivating the heater associated with the stage.

19. The method of claim 14, wherein the operation of flowing the fluid through the conduit cools the molten BMG at a rate that results in the solid BMG sheet having an amorphous microstructure after solidification.

20. The method of claim 14, wherein:
- the operation of disposing the BMG feedstock on the stage comprises disposing the BMG feedstock in a cavity defined by one or more sidewalls; and
- the operation of spinning the stage to spread the molten BMG comprises spinning the stage until the molten BMG contacts the one or more sidewalls.

* * * * *